(12) United States Patent
Yen et al.

(10) Patent No.: US 8,089,572 B2
(45) Date of Patent: Jan. 3, 2012

(54) PIXEL STRUCTURE, THIN FILM TRANSISTOR ARRAY SUBSTRATE, DISPLAY PANEL, AND DISPLAY APPARATUS WITH PARTICULAR PARASITIC CAPACITANCE COMPENSATION

(75) Inventors: Ssu-Lin Yen, Taipei County (TW); Chin-Hai Huang, Taoyuan County (TW); Kuang-Kuei Wang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 429 days.

(21) Appl. No.: 12/486,745

(22) Filed: Jun. 17, 2009

(65) Prior Publication Data
US 2010/0259699 A1 Oct. 14, 2010

(30) Foreign Application Priority Data

Apr. 10, 2009 (TW) .............................. 98112022 A

(51) Int. Cl.
G02F 1/1343 (2006.01)
G02F 1/1333 (2006.01)
(52) U.S. Cl. .............................. 349/38; 349/39; 349/158
(58) Field of Classification Search .................... 349/38, 349/39, 158
See application file for complete search history.

(56) References Cited

U.S. PATENT DOCUMENTS

| | | | | |
|---|---|---|---|---|
| 5,151,689 A | * | 9/1992 | Kabuto et al. ................. | 345/103 |
| 7,567,324 B2 | * | 7/2009 | Lee et al. ....................... | 349/139 |
| 7,633,568 B2 | * | 12/2009 | Lin et al. ......................... | 349/38 |
| 2007/0103609 A1 | * | 5/2007 | Kang et al. ..................... | 349/38 |

FOREIGN PATENT DOCUMENTS

TW 200733394 9/2007

* cited by examiner

Primary Examiner — Mike Qi
(74) Attorney, Agent, or Firm — Jianq Chyun IP Office

(57) ABSTRACT

A pixel structure adapts for compensating variation of gate-drain parasitic capacitance caused by misalignment in manufacturing process by forming a transverse compensation capacitance between a capacitance compensation portion and a scan line in an in-plane direction, and therefore the flicker in displaying of a display panel can be alleviated. In addition, being applied into a concept of "data lines reducing", the pixel structure is capable of reducing difference of capacitance between two adjacent pixel structures due to misalignment in manufacturing process and improving display uniformity. Furthermore, a thin film transistor array substrate, a display panel, and a display apparatus applying the pixel structure are also provided.

35 Claims, 9 Drawing Sheets

US 8,089,572 B2

PIXEL STRUCTURE, THIN FILM TRANSISTOR ARRAY SUBSTRATE, DISPLAY PANEL, AND DISPLAY APPARATUS WITH PARTICULAR PARASITIC CAPACITANCE COMPENSATION

CROSS-REFERENCE TO RELATED APPLICATION

This application claims the priority benefit of Taiwan application serial no. 98112022, filed Apr. 10, 2009. The entirety of the above-mentioned patent application is hereby incorporated by reference herein and made a part of specification.

BACKGROUND OF THE INVENTION

1. Field of the Invention

The present invention relates to a display panel, and more particularly to a pixel structure of a display panel.

2. Description of Related Art

A thin film transistor liquid crystal display (TFT-LCD) mainly includes a thin film transistor (TFT) array, a color filter and a liquid crystal layer. FIG. 1 is a schematic view of a conventional TFT array substrate. Referring to FIG. 1, a TFT array substrate 100 mainly includes a plurality of pixel structures 110 arranged in array. Each of the pixel structures 110 includes a scan line 112, a data line 114, a TFT 116 and a pixel electrode 118, etc.

In brief, the TFT 116 is used as a switch element of each pixel structure 110 while the scan line 112 and the data line 114 are used to provide the selected pixel structure 110 with proper operating voltages for respectively driving the selected pixel structure 110 to display an image.

FIG. 2 is a schematic equivalent circuit drawing of a single pixel in a conventional TFT-LCD. Referring to FIG. 2, a single pixel of a conventional TFT-LCD generally comprises a thin film transistor 116, a liquid crystal capacitance $C_{LC}$ and a storage capacitance $C_{st}$.

Referring to FIGS. 1 and 2, the liquid crystal capacitance $C_{LC}$ is formed by coupling the pixel electrode 118 on the TFT array substrate 100 and a common electrode on the color filter (not shown). The storage capacitance $C_{st}$ disposed on the TFT array substrate 100 is connected to the liquid crystal capacitance $C_{LC}$ in parallel. In addition, the gate G, the source S and the drain D of the TFT 116 are connected to the scan line 112, the data line 114 and the pixel electrode 118 forming the liquid crystal capacitance $C_{LC}$, respectively. Since the gate G and the drain D of the TFT 116 are partially overlapped in an overlapping region, a gate-drain parasitic capacitance $C_{gd}$ is existed between the gate G and the drain D.

Referring to FIG. 1 and FIG. 2 again, since there exists a specific relationship between a voltage applied the liquid crystal capacitance $C_{LC}$(i.e. a voltage applied to the pixel electrode 118 and the common electrode) and a light transmittance of liquid crystal molecules, a predetermined image can be displayed by controlling the voltage applied the liquid crystal capacitance $C_{LC}$ in accordance with the desired predetermined image. Wherein, as the TFT 116 is off, the voltage applied on the liquid crystal capacitance $C_{LC}$ theoretically keeps unchanged, i.e. in a holding state. However, due to the presence of the gate-drain parasitic capacitance $C_{gd}$, the voltage kept by the liquid crystal capacitance $C_{LC}$ varies slightly with the changed signals on the data line 114, called a coupling effect. Therefore, the voltage kept by the liquid crystal capacitance $C_{LC}$ is eventually apart from the predetermined value.

Among current exposure processes for fabricating the TFT array substrate, adjoined photomasks of a stepper exposing machine are mostly used to perform the exposure process for forming the TFT array substrate. Therefore, a displacement error of movements of the stepper during the exposure process would cause nonconformity among the pattern positions in each shot. Particularly, among each of the shots, when the overlapping region of the gate G and the drain D of the TFT 116 as shown in FIG. 1 varies, the gate-drain parasitic capacitance $C_{gd}$ in each of the shots is changed and thus the problem of uneven brightness, i.e. flicker, during displaying is occurred.

SUMMARY OF THE INVENTION

The present invention is directed to a pixel structure, wherein the variation of the gate-drain parasitic capacitance caused by misalignment in the manufacturing process is reduced to improve the display quality.

The present invention is directed to a pixel structure, wherein the variation of the liquid crystal capacitances between the two adjacent pixel structures caused by misalignment in the manufacturing process is improve to enhance the display uniformity.

The present invention is additionally directed to a TFT array substrate applying the above pixel structure to compensate the variation of the gate-drain parasitic capacitance caused by misalignment in the manufacturing process to improve the display quality of the display panel.

The present invention is further directed to display panel using the above-mentioned TFT array substrate, wherein the variation of the gate-drain parasitic capacitance caused by misalignment in the manufacturing process is avoided so as to have better display quality.

The present invention is further directed to a display apparatus applying the foregoing display panel.

As embodied and broadly described herein, a pixel structure is provided here. The pixel structure includes a first scan line, a second scan line, a data line, a TFT, a pixel electrode and a capacitance compensation portion. The extending direction of the first scan line and the extending direction of the second scan line are parallel and the data line intersects with the first scan line and the second scan line respectively to define a pixel region. The TFT is located inside the pixel region and the TFT has a gate, a source and a drain. The gate is connected to the first scan line, the source is connected to the data line, and the drain and the gate are overlapped in an overlapping region in an out-plane direction to form a gate-drain parasitic capacitance. The pixel electrode is located inside the pixel region and the pixel electrode is electrically connected to the drain. The capacitance compensation portion is electrically connected to the pixel electrode and the capacitance compensation portion keeps a gap from the first scan line or the second scan line in an in-plane direction to induce a compensation capacitance. In this pixel structure, the drain and the capacitance compensation portion are configured that when the overlapping region is reduced to decrease the gate-drain parasitic capacitance, the gap is reduced correspondingly to increase the compensation capacitance, and when the overlapping region is enlarged to increase the gate-drain parasitic capacitance, the gap is enlarged correspondingly to decrease the compensation capacitance. In an embodiment of the present invention, the capacitance compensation portion is a bar-shaped structure or a block structure extending along the first scan line or the second scan line.

In an embodiment of the present invention, the capacitance compensation portion and the pixel electrode are respectively located at two opposite sides of the first scan line. In addition, the pixel structure may further include a connection portion traversing the first scan line for connecting the capacitance compensation portion and the drain.

In an embodiment of the present invention, the capacitance compensation portion is located inside the pixel region, wherein the drain is adjacent to the first scan line, the capacitance compensation portion is adjacent to the second scan line, and the capacitance compensation portion keeps the gap from the second scan line in the in-plane direction.

In an embodiment of the present invention, the pixel structure further includes a common line located inside the pixel region and disposed along the periphery of the pixel electrode.

Another pixel structure is provided. The pixel structure includes a first scan line, s second scan line, a data line, a first TFT, a first pixel electrode, a first capacitance compensation portion, a second TFT, a second pixel electrode and a second capacitance compensation portion. The extending direction of the first scan line and the extending direction of the second scan line are parallel. The data line intersects the first scan line and the second scan line respectively to define a first pixel region and a second pixel region adjacent thereto, wherein the first pixel region and the second pixel region are respectively located at two opposite sides of the data line. The first TFT is located inside the first pixel region and the first TFT has a first gate, a first source and a first drain. The first gate is connected to the first scan line, the first source is connected to the data line, and the first drain and the first gate are overlapped in a first overlapping region in an out-plane direction to form a first gate-drain parasitic capacitance. In addition, the first pixel electrode is located inside the first pixel region and the first pixel electrode is electrically connected to the first drain. The first capacitance compensation portion is electrically connected to the first pixel electrode and the first capacitance compensation portion keeps a first gap from the first scan line or the second scan line in an in-plane direction to induce a first compensation capacitance. In this pixel structure, the first drain and the first capacitance compensation portion are configured that when the first overlapping region is reduced to decrease the first gate-drain parasitic capacitance, the first gap is reduced correspondingly to increase the first compensation capacitance, and when the first overlapping region is enlarged to increase the first gate-drain parasitic capacitance, the first gap is enlarged correspondingly to decrease the first compensation capacitance. Furthermore, the second TFT is located inside the second pixel region and the second TFT has a second gate, a second source and a second drain. The second gate is connected to the second scan line, the second source is connected to the data line, and the second drain and the second gate are overlapped in the second overlapping region in an out-plane direction to form a second gate-drain parasitic capacitance. The second pixel electrode is located inside the second pixel region and the second pixel electrode is electrically connected to the second drain. The second capacitance compensation portion is electrically connected to the second pixel electrode and the second capacitance compensation portion keeps a second gap from the first scan line or the second scan line in the in-plane direction to induce a second compensation capacitance. In this pixel structure, the second drain and the second capacitance compensation portion are configured that when the second overlapping region is reduced to decrease the second gate-drain parasitic capacitance, the second gap is reduced correspondingly to increase the second compensation capacitance, and when the second overlapping region is enlarged to increase the second gate-drain parasitic capacitance, the second gap is enlarged correspondingly to decrease the second compensation capacitance.

In an embodiment of the present invention, the first capacitance compensation portion is a bar-shaped structures or a block structure extending along the first scan line or the second scan line. In addition, the second capacitance compensation portion can also be a bar-shaped structure or a block structure extending along the first scan line or the second scan line.

In an embodiment of the present invention, the first capacitance compensation portion and the first pixel electrode are respectively located at two opposite sides of the first scan line.

In an embodiment of the present invention, the pixel structure may further include a first connection portion traversing the first scan line for connecting the first capacitance compensation portion and the first drain.

In an embodiment of the present invention, the second capacitance compensation portion and the second pixel electrode are respectively located at two opposite sides of the second scan line.

In an embodiment of the present invention, the pixel structure may further include a second connection portion traversing the second scan line for connecting the second capacitance compensation portion and the second drain.

In an embodiment of the present invention, the first capacitance compensation portion is located inside the first pixel region, the first drain is adjacent to the first scan line, and the first capacitance compensation portion is adjacent to the second scan line and keeps the first gap from the second scan line in the in-plane direction.

In an embodiment of the present invention, the second capacitance compensation portion is located inside the second pixel region, the second drain is adjacent to the second scan line, and the second capacitance compensation portion is adjacent to the first scan line and keeps the second gap from the first scan line in the in-plane direction.

In an embodiment of the present invention, the pixel structure further includes two common lines respectively located inside the first pixel region and the second pixel region, and respectively disposed along the peripheries of the first pixel electrode and the second pixel electrode.

A TFT array substrate is further provided. The TFT array substrate includes a substrate, a plurality of scan lines, a plurality of data lines, a plurality of TFTs, a plurality of pixel electrodes and a plurality of capacitance compensation portions. The substrate has a plurality of pixel regions. The scan lines and the data lines are disposed on the substrate and the scan lines intersect the data lines. The TFTs are respectively located inside the pixel regions and each of the TFTs has a gate, a source and a drain. The gate is connected to the corresponding scan line, the source is connected to the corresponding data line, and the drain and the gate are overlapped in an overlapping region in an out-plane direction to form a gate-drain parasitic capacitance. In addition, the pixel electrodes are respectively disposed inside the pixel regions and electrically connected to the corresponding drains. The capacitance compensation portions are disposed corresponding to the pixel regions, wherein each of the capacitance compensation portions keeps a gap from one of the two scan lines at two opposite sides of the corresponding pixel region in an in-plane direction to induce a compensation capacitance. In this pixel structure, each of the drains and the corresponding capacitance compensation portion are configured that when the overlapping region is reduced to decrease the gate-drain parasitic capacitance, the gap is reduced correspondingly to increase the compensation capacitance, and when the overlapping region is enlarged to increase the gate-drain parasitic capacitance, the gap is enlarged correspondingly to decrease the compensation capacitance.

In an embodiment of the present invention, each of the capacitance compensation portions is a bar-shaped structure or a block structure extending along the corresponding scan line.

In an embodiment of the present invention, each of the capacitance compensation portions and the corresponding pixel electrodes are respectively located at two opposite sides of the same scan line. In addition, the TFT array substrate may further include a plurality of connection portions respectively disposed corresponding to the pixel regions. Each of the connection portions traverses the corresponding scan line and is connected between the corresponding capacitance compensation portion and the corresponding drain.

In an embodiment of the present invention, each of the capacitance compensation portions and the corresponding pixel electrodes are located in the same pixel region and are respectively adjacent to two different scan lines at two opposite sides of the pixel region. The capacitance compensation portions keep the gap from the close scan lines in the in-plane direction.

In an embodiment of the present invention, the pixel regions are arranged in columns and rows. The scan lines extend along the direction of the rows and the data lines extend along the direction of the columns. Each of the two adjacent pixel regions in the same row are delimited a group, the two thin film transistors inside the two pixel regions of the same group are simultaneously connected to the same data line which is located between the two pixel regions. In addition, the two TFTs in the two pixel regions of the same group may further be respectively adjacent to two different scan lines and are respectively connected the two different scan lines. In an embodiment of the present invention, the TFT array substrate further includes a plurality of common lines respectively located inside the pixel regions and each of the common lines is disposed along the periphery of the corresponding pixel electrode.

A display panel applying the above-mentioned plurality of pixel structures and the TFT array substrate is further provided. The display panel mainly includes the above TFT array substrate, an opposite substrate and a display medium layer. The display medium layer is disposed between the TFT array substrate and the opposite substrate.

Furthermore, a display apparatus is provided by integrating the above-mentioned display panel and a backlight module, wherein the backlight module is disposed beside the display panel to provide a back light to the display panel.

In brief, the pixel structure provided in the present invention is capable of compensating variation of gate-drain parasitic capacitance caused by misalignment in the manufacturing process by forming a transverse compensation capacitance between a capacitance compensation portion and a scan line in an in-plane direction, and therefore the flicker in displaying of a display panel can be alleviated. In addition, being applied into a concept of "data lines reducing", the pixel structure is capable of reducing difference of capacitance between two adjacent pixel structures due to misalignment in the manufacturing process and is apt to improve display uniformity.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
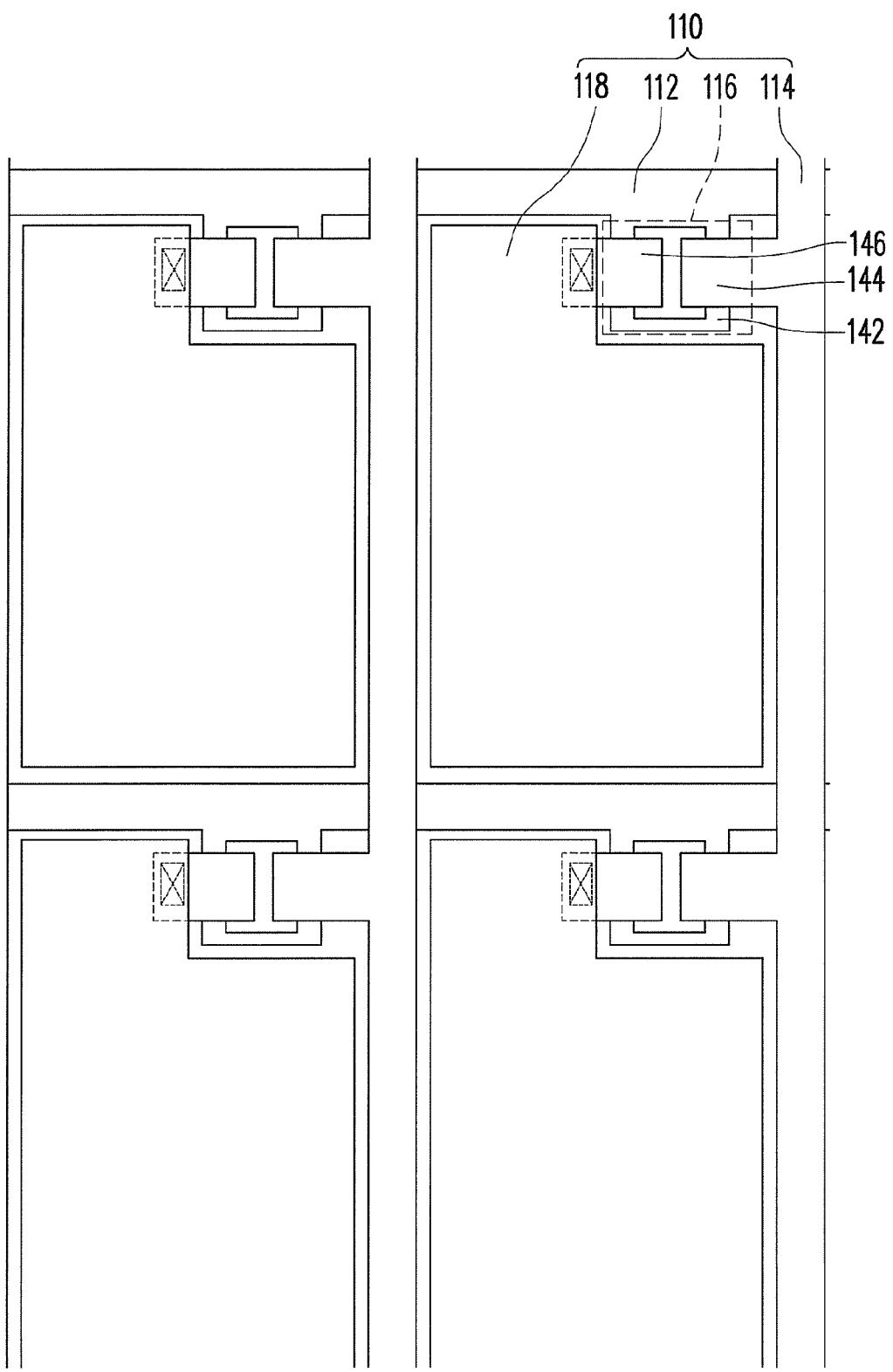
FIG. 1 is a schematic view of a conventional TFT array substrate.
Figure 2:
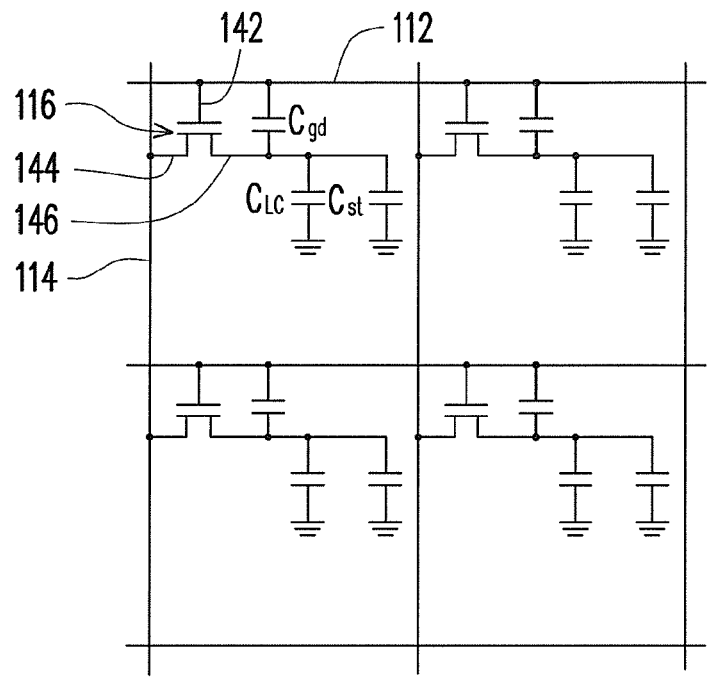
FIG. 2 is a schematic equivalent circuit drawing of a single pixel in a conventional TFT-LCD.
Figure 3:
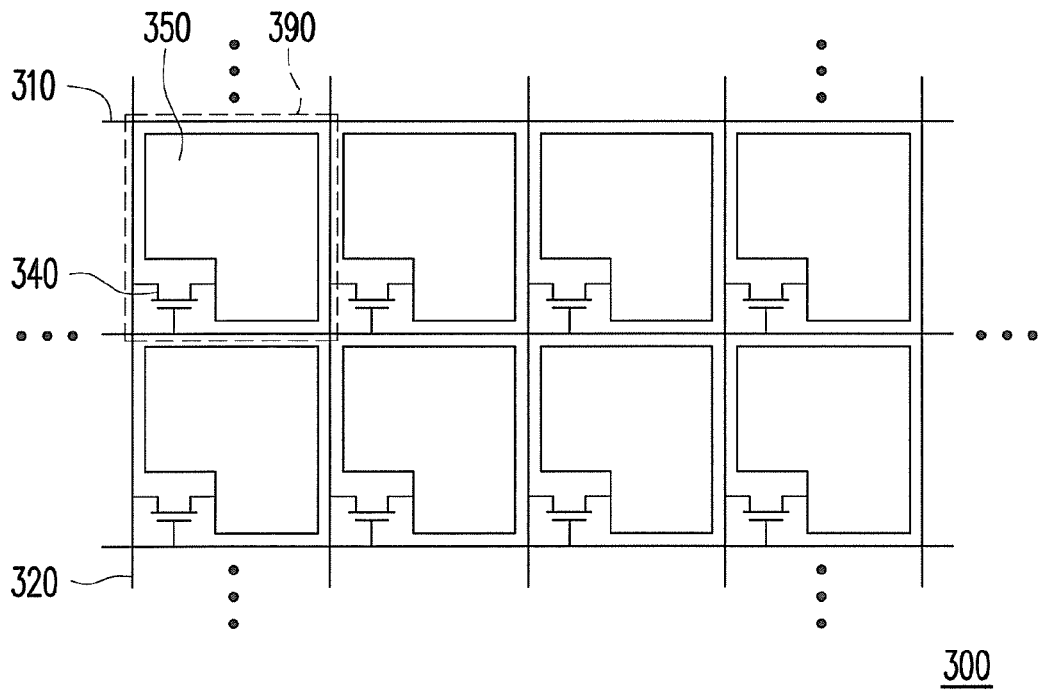
FIG. 3 illustrates a layout of a TFT array substrate according to an embodiment of the present invention.

FIG. 3 illustrates a layout of a TFT array substrate according to an embodiment of the present invention. The TFT array substrate of the present embodiment can be applied to kinds of display panels such as a liquid crystal display panel or an organic electroluminescent display panel to drive the display medium to display an image. The present embodiment takes the application of the TFT array substrate to the liquid crystal display panel as an example. As shown in the TFT array substrate 300 in FIG. 3, the present invention is provided by forming a plurality of scan lines 310 and a plurality of data lines 320 on a substrate (not shown). The substrate mentioned here is a glass substrate or a quartz substrate, for example. The scan lines 310 are parallel to each other and intersected with the data lines 320 to define a plurality of pixel regions 390. A pixel structure disposed inside each of the pixel regions 390 mainly includes a TFT 340 electrically connected to the corresponding scan line 310 and the data line 320, and a pixel electrode 350 located inside the pixel region 390 and electrically connected to the corresponding TFT 340.

Figure 4:
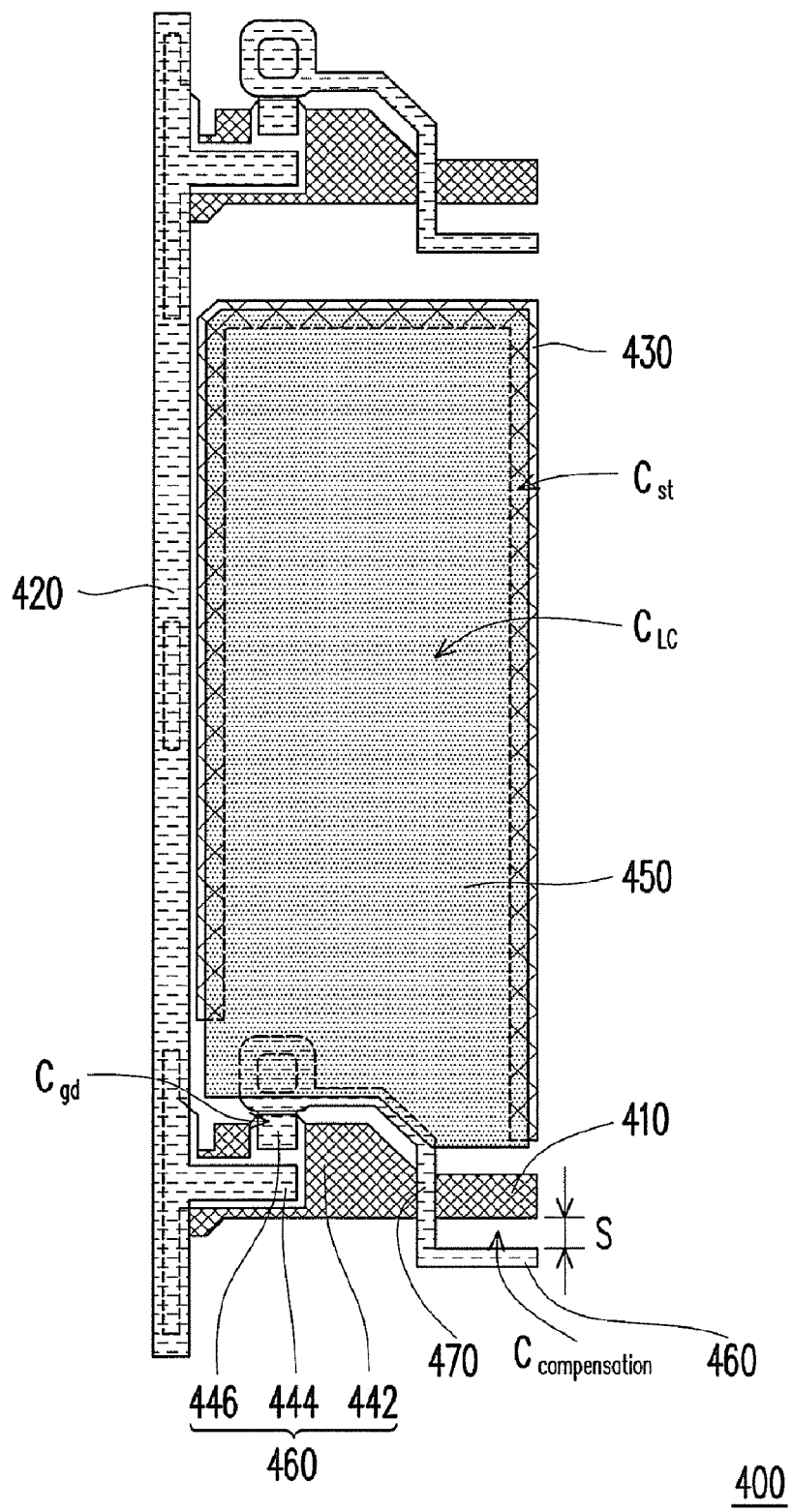
FIG. 4 illustrates a pixel structure of the TFT array substrate in FIG. 3.
Figure 5:
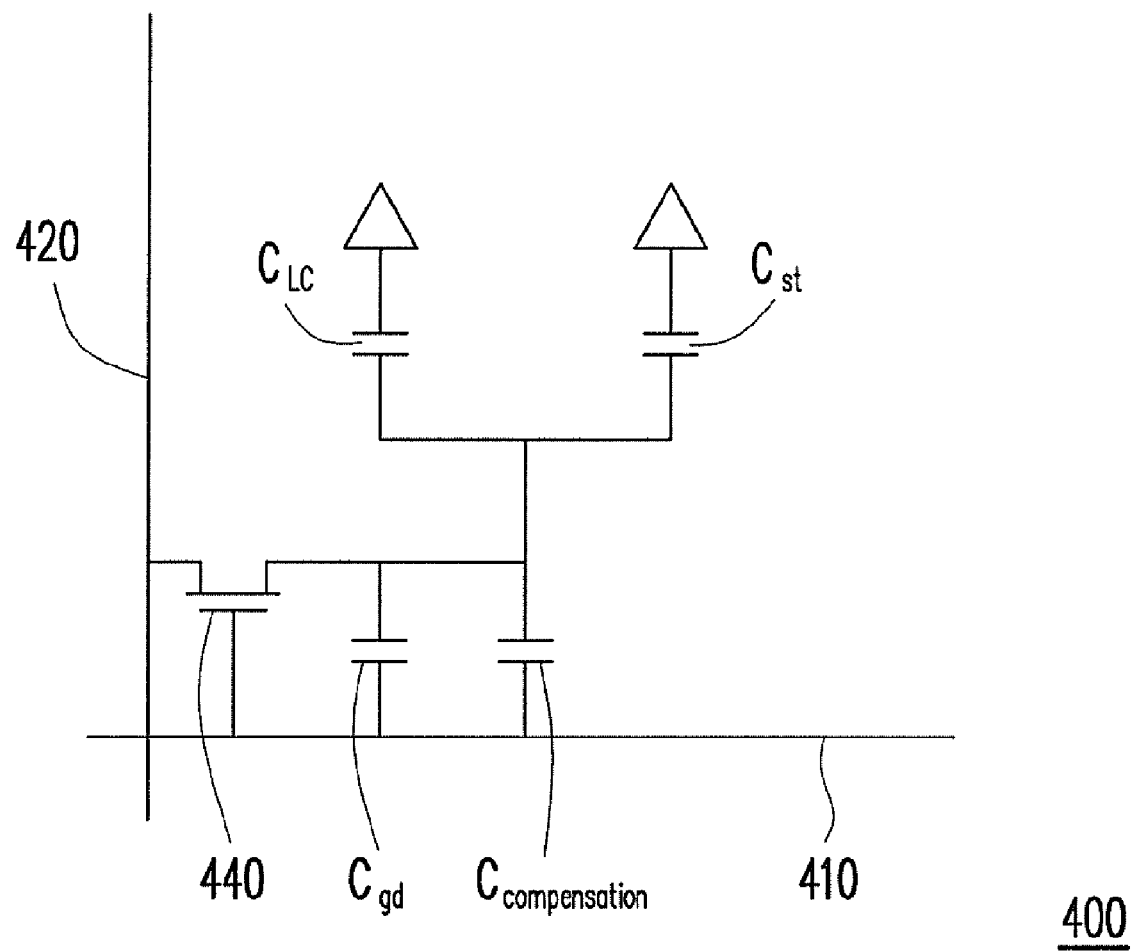
FIG. 5 is an equivalent circuit diagram of the pixel structure in FIG. 4.

To further specify the present invention, FIG. 4 further illustrates a pixel structure of the TFT array substrate in FIG. 3, and FIG. 5 is an equivalent circuit diagram of the pixel structure in FIG. 4. Although FIGS. 4 and 5 only represented a single pixel structure, a person of ordinary skill in the art can certainly derive the entire structure of the TFT array substrate consisting of a plurality of pixel structures from the single pixel structure.

As shown in FIGS. 4 and 5, the pixel structure 400 mainly includes a scan line 410, a data line 420, a common line 430, a TFT 440 and a pixel electrode 450. The TFT 440 has a gate 442, a source 444 and a drain 446, wherein the gate 442 is connected to the scan line 410, the source 444 is connected to the data line 420, and the drain 446 and the gate 442 are overlapped in an overlapping region in an out-plane direction (i.e. the direction perpendicular to the figure sheet) so as to form a gate-drain parasitic capacitance $C_{gd}$. It is noted that the gate 442 represented in the present embodiment can be actually considered as a part of the scan line 410, that is, the TFT 440 is configured on the scan line 410. Certainly, in other pixel structures not illustrated here, the scan line can extend outward to form the gate so that the TFT is disposed outside the scan line. In addition, the pixel electrode 450 is electrically connected to the drain 446 to receive a display voltage and form a liquid crystal capacitance $C_{LC}$ thereon. Furthermore, the common line 430 is disposed along the periphery of the pixel electrode 450 and thus a storage capacitance $C_{st}$ is formed between the common line 430 and the pixel electrode 450, wherein the storage capacitance $C_{st}$ is electrically connected to the liquid crystal capacitance $C_{LC}$ in parallel.

In considering the variation of the gate-drain parasitic capacitance $C_{gd}$ caused by the disalignment in the manufacturing process, referring to FIG. 5, a compensation capacitance $C_{compensation}$ is configured in the pixel structure 400 so as to compensate the variation of the gate-drain parasitic capacitance $C_{gd}$ through the compensation capacitance $C_{compensation}$. In particular, the gate-drain parasitic capacitance $C_{gd}$ and the compensation capacitance $C_{compensation}$ are configured to comply with the following relationship that when the gate-drain parasitic capacitance $C_{gd}$ is decreased, the compensation capacitance $C_{compensation}$ must be increased correspondingly, and when the gate-drain parasitic capacitance $C_{gd}$ is increased, the compensation capacitance $C_{compensation}$ must be decreased correspondingly.

FIG. 4 illustrates an implementation type based on the above design concept. As shown in FIG. 4, the pixel structure 400 further includes a capacitance compensation portion 460 electrically connected to the pixel electrode 450, and the capacitance compensation portion 460 keep in a gap S from the scan line 410 in the in-plane direction (the direction parallel to the figure sheet) to induce a transverse compensation capacitance $C_{compensation}$. More particularly, the capacitance compensation portion 460 and the pixel electrode 450 are respectively located at two opposite sides of the scan line 410, and the capacitance compensation portion 460 is connected to the drain 446 through a connection portion 470 traversing the scan line 410. The capacitance compensation portion 460 is, for example, a bar-shaped structure extending along the scan line 410.

The above-mentioned concept is capable of being realized through the pixel structure 400 shown in FIG. 4. Specifically, when the overlapping region between the drain 446 and the gate 442 is reduced due to the misalignment in the manufacturing process, the gate-drain parasitic capacitance $C_{gd}$ is decreased relatively. However, owing to the disposition of the capacitance compensation portion 460, the gap S between the capacitance compensation portion 460 and the scan line 410 is reduced correspondingly when the overlapping region between the drain 446 and the gate 442 is reduced so as to increase the compensation capacitance $C_{compensation}$. Accordingly, the gate-drain parasitic capacitance $C_{gd}$ is substantially compensated through the compensation capacitance $C_{compensation}$. Similarly, when the overlapping region between the drain 446 and the gate 442 is enlarged to increase the gate-drain parasitic capacitance $C_{gd}$, the gap S between the capacitance compensation portion 460 and the scan line 410 is enlarged correspondingly to decrease the compensation capacitance $C_{compensation}$ to compensate the variation of the gate-drain parasitic capacitance $C_{gd}$.

Figure 6:
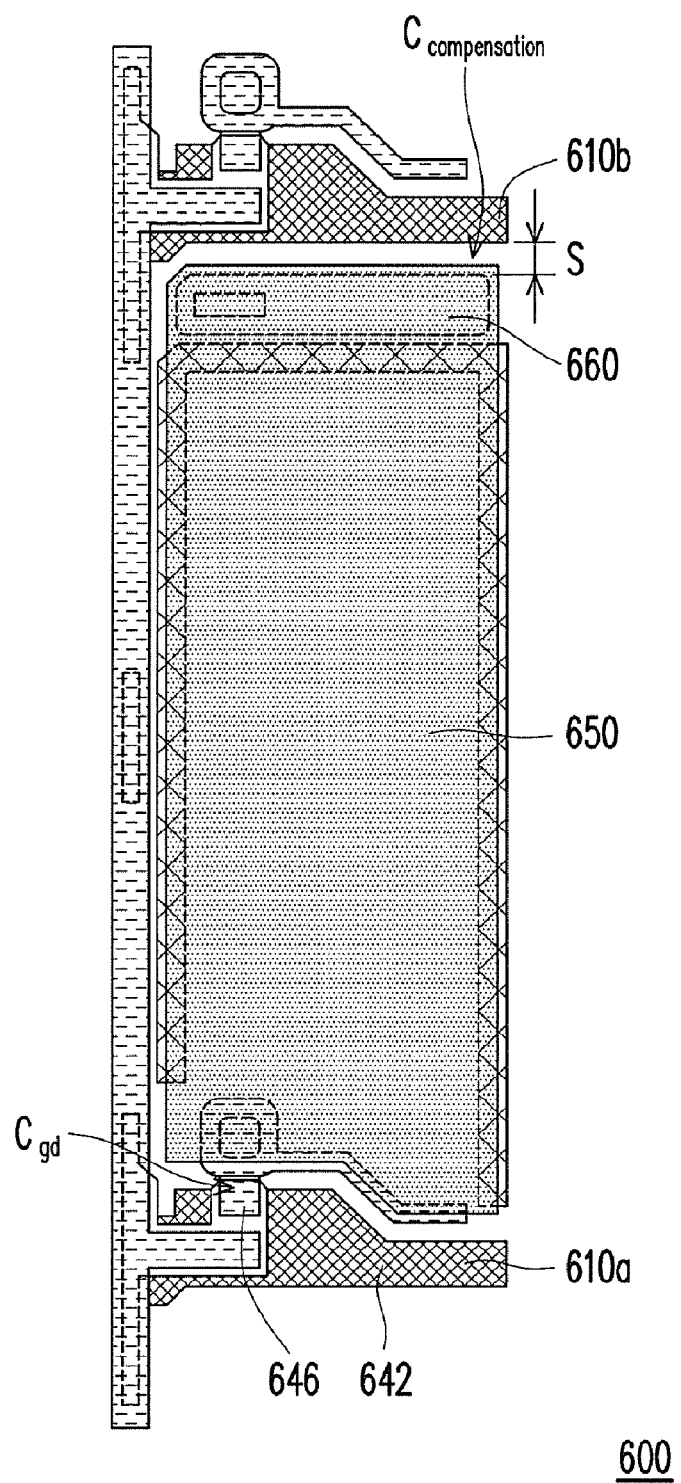
FIG. 6 illustrates a pixel structure according to another embodiment of the present invention.

In addition to the above pixel structure, FIG. 6 further illustrates a pixel structure according to another embodiment of the present invention to depict another implement type of the above-mentioned design concept. The elements shown in the foregoing embodiments are not repeated here and the related description is omitted. As shown in FIG. 6, the capacitance compensation portion 660 of the pixel structure 600 in the present embodiment is a block structure extending along the scan line 610b and is located at the same pixel region where the pixel electrode 650 is located at. The drain 646 is adjacent to the scan line 610a. The capacitance compensation portion 660 is adjacent to the scan line 610b and keeps a gap S from the scan line 610b in the in-plane direction. In another word, the capacitance compensation portion 660 is configured beside the scan line 610b of the adjacent pixel structure in the present embodiment so as to keep the gap S between the capacitance compensation portion 660 and the scan line 610b to induce the compensation capacitance $C_{compensation}$.

The above-mentioned concept is capable of being realized through the pixel structure 600 shown in FIG. 6. Specifically, when the overlapping region between the drain 646 and the gate 642 is reduced caused by the misalignment in the manufacturing process, the gate-drain parasitic capacitance $C_{gd}$ is decreased oppositely. However, owing to the disposition of the capacitance compensation portion 660, the gap S between the capacitance compensation portion 660 and the scan line 610a is reduced correspondingly when the overlapping region between the drain 646 and the gate 642 is reduced so as to increase the compensation capacitance $C_{compensation}$. Accordingly, the gate-drain parasitic capacitance $C_{gd}$ is substantially compensated through the compensation capacitance $C_{compensation}$. Similarly, when the overlapping region between the drain 646 and the gate 642 is enlarged to increase the gate-drain parasitic capacitance $C_{gd}$, the gap S between the capacitance compensation portion 660 and the scan line 610b is enlarged correspondingly to decrease the compensation capacitance $C_{compensation}$ to compensate the variation of the gate-drain parasitic capacitance $C_{gd}$.

In addition to the above-mentioned embodiments, the design concept to compensate the variation of the gate-drain parasitic capacitance through the capacitance compensation portion is capable of being applied to other suitable pixel structures. An implement type of the pixel structure design which combines the present design concept and the "data line reducing" concept is described in the following. The design of the "data line reducing" concept means that the two adjacent pixels share the same data line such that the quantity of the data lines is reduced to save the manufacturing cost.

Figure 7:
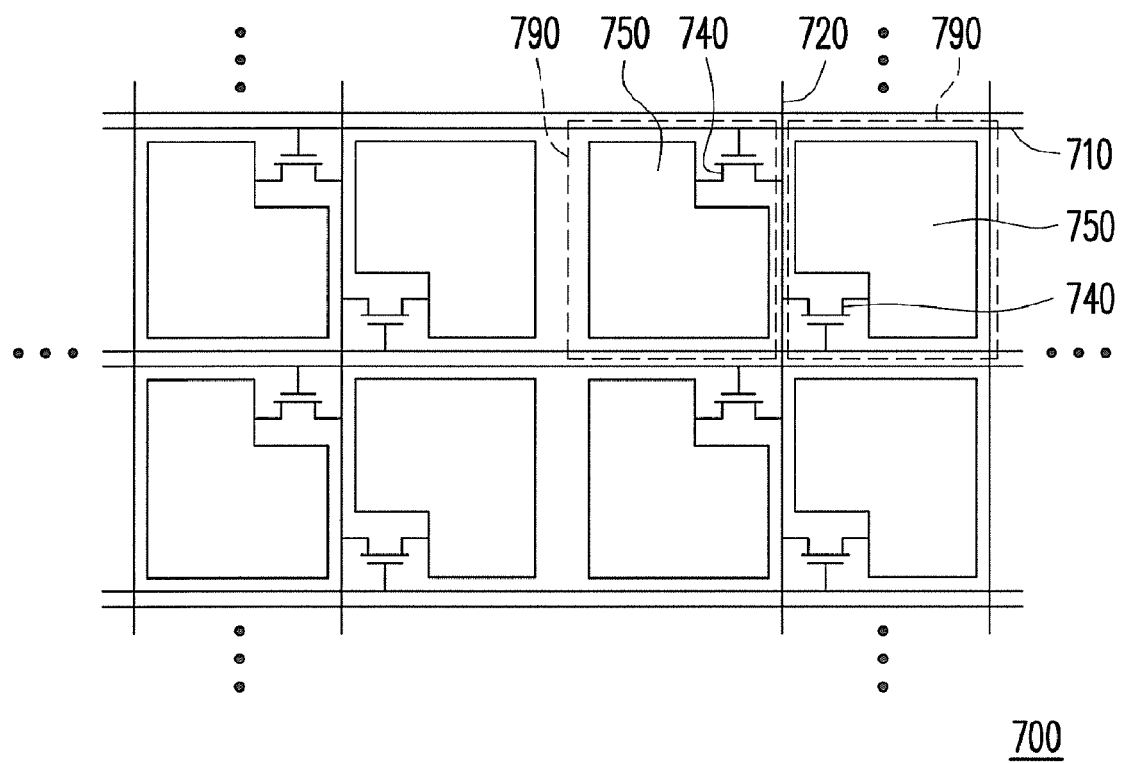
FIG. 7 illustrates a layout of a TFT array substrate according to another embodiment of the present invention.

FIG. 7 illustrates a layout of a TFT array substrate according to another embodiment of the present invention. As described in the foregoing, the TFT array substrate 700 which adopts the design of the "data line reducing" concept includes a plurality of scan lines 710, a plurality of data lines 720, a plurality of TFTs 740 and a plurality of pixel electrodes 750. The scan lines 710 are parallel to each other and intersected with the data lines 720 to define a plurality of pixel regions 790. The pixel regions 790 are arranged in columns and rows, wherein the scan lines 710 are extended along the direction of the rows and the data lines 720 are extended along the direction of the columns. Each two adjacent pixel regions 790 in the same row are delimited a group, the two TFTs 740 inside the two pixel regions 790 of the same group are simultaneously connected to the same data line 720 located between the two pixel regions 790. In the present embodiment, the TFTs 740 in the two pixel regions 790 of the same group are configured at the opposite corners, that is to say, the TFTs 740 are respectively adjacent to and driven by two different scan lines 710. In addition, the pixel electrodes 750 are respectively disposed inside the pixel regions 790 and electrically connected to the corresponding TFTs 740.

Figure 8:
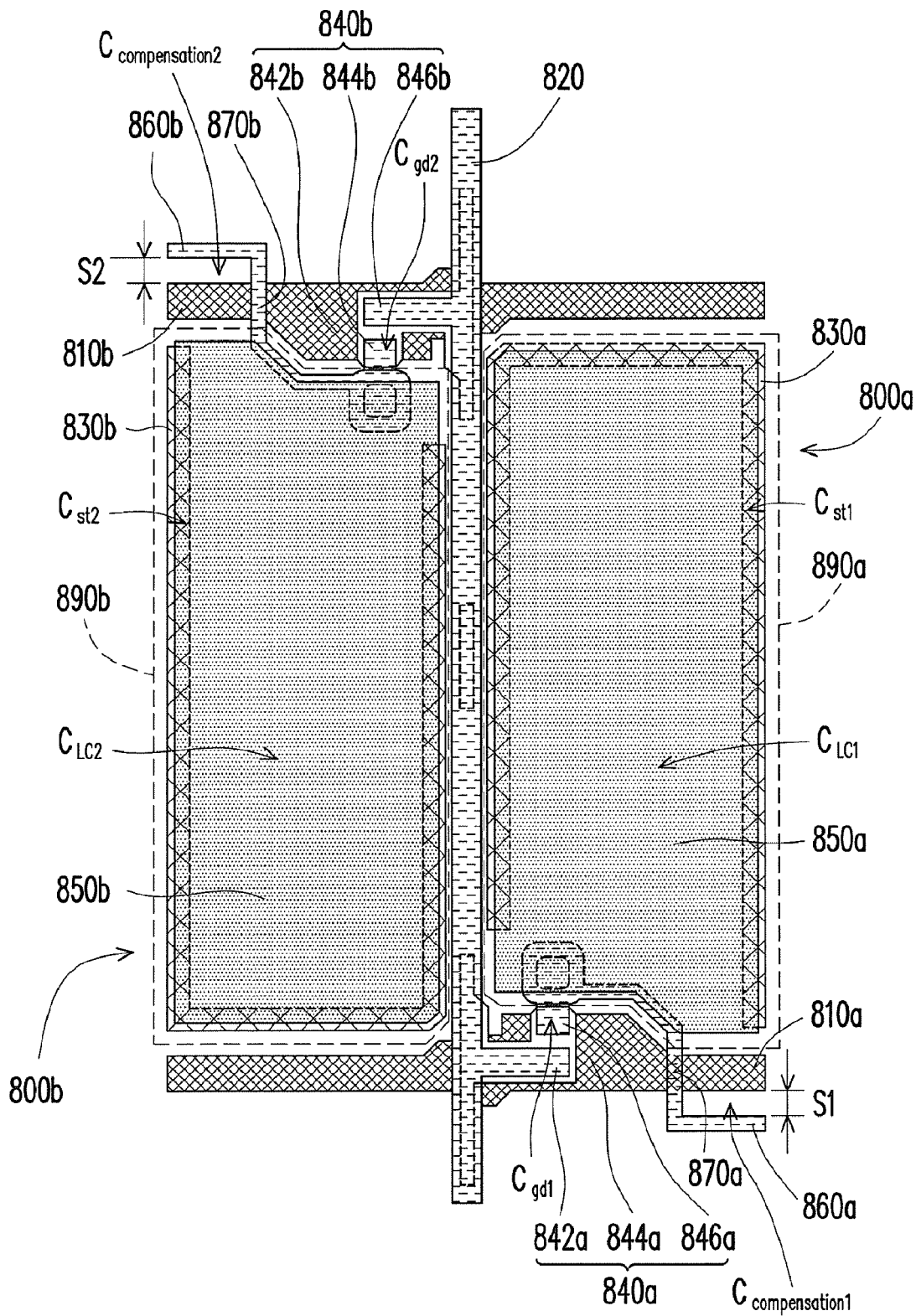
FIG. 8 illustrates a pixel structure of the TFT array substrate in FIG. 7.

To further illustrate the present invention, FIG. 8 shows a pixel structure of the TFT array substrate in FIG. 7. Although FIG. 8 only represents a single pixel structure, a person of ordinary skill in the art can certainly derive the entire structure of the TFT array substrate consisting of a plurality of pixel structure from the single pixel structure. In addition, the pixel structure shown in FIG. 4 is applied to the TFT array substrate shown in FIG. 7 in the present embodiment, wherein the two adjacent pixel structures share one data line and thus the components such as a TFT, a pixel electrode and a common line in each of the pixel structures are configured symmetrically.

As shown in FIG. 8, the pixel structure (not marked) of the present embodiment includes a first scan line 810a and a second scan line 810b, and the extending direction of the first scan line 810a is parallel to the extending direction of the second scan line 810b. The data line 820 intersects the first scan line 810a and the second scan line 810b to define a first pixel region 890a and a second pixel region 890b adjacent thereto, wherein the first pixel region 890a and the second pixel region 890b are respectively located at two opposite sides of the data line 820. That is to say, the first pixel structure 800a in the first pixel region 890a and the second pixel structure 800b in the second pixel region 890b share the same one data line 820.

Besides, a first TFT 840a is located inside the first pixel region 890a in the first pixel structure 800a and the first TFT 840a includes a first gate 842a, a first source 844a and a first drain 846a. The first gate 842a is connected to the first scan line 810a, the first source 844a is connected to the data line 820, and the first drain 846a and the first gate 842a are overlapped in a first overlapping region in the direction vertical to the figure sheet to form a first gate-drain parasitic capacitance $C_{gd1}$. It is noted that the first gate 842a represented in the present embodiment can be actually considered as a part of the first scan line 810a, that is, the TFT 840a is configured on the first scan line 810a. Certainly, in other pixel structures not illustrated here, the scan line can extend outward to form the gate such that the TFT is disposed outside the scan line. In addition, the first pixel electrode 850a is electrically connected to the first drain 846a to receive a display voltage and form a first liquid crystal capacitance $C_{LC1}$ thereon. Furthermore, a first common line 830a is disposed along the periphery of the first pixel electrode 850a to form a first storage capacitance $C_{st1}$ between the first common line 830a and the first pixel electrode 850a, wherein the first storage capacitance $C_{st1}$ is electrically connected to the first liquid crystal capacitance $C_{LC1}$ in parallel.

Similarly, a second TFT 840b is located inside the second pixel region 890b in the second pixel structure 800b and the second TFT 840b has a second gate 842b, a second source 844b and a second drain 846b. The second gate 842b is connected to the second scan line 810b, the second source 844b is connected to the data line 820, and the second drain 846b and the second gate 842b are overlapped in a second overlapping region in a direction vertical to the figure sheet to form a second gate-drain parasitic capacitance $C_{gd2}$. It is noted that the second gate 842b represented in the present embodiment can be actually considered as a part of the second scan line 810b, that is, the second TFT 840b is configured on the second scan line 810b. Certainly, in other pixel structures not shown here, the scan line can extend outward to form the gate so that the TFT is disposed outside the scan line. In addition, the second pixel electrode 850b is electrically connected to the second drain 846b to receive a display voltage and form a second liquid crystal capacitance $C_{LC2}$ thereon. Furthermore, a second common line 830b is disposed along the periphery of the second pixel electrode 850b to form a second storage capacitance $C_{st2}$ between the second common line 830b and the second pixel electrode 850b, wherein the second storage capacitance $C_{st2}$ is electrically connected to the second liquid crystal capacitance $C_{LC2}$ in parallel.

It is worthy to note that the elements of the pixel structure complying the concept of "data line reducing" in the present embodiment are disposed symmetrically and thus the gate-drain parasitic capacitances $C_{gd1}$ and $C_{gd2}$ of the two adjacent pixel structures 800a and 800b are changed in opposite tendencies when the misalignment in the manufacturing process is occurred such that the variation between the gate-drain parasitic capacitances $C_{gd1}$ and $C_{gd2}$ of the two adjacent pixel structures 800a and 800b is intensified to influence the display quality. More particularly, the overlapping region between the first drain 846a and the first gate 842a is reduced when the misalignment in Y+ direction is occurred, and the first gate-drain parasitic capacitance $C_{gd1}$ is decreased correspondingly. Meanwhile, the overlapping region between the second drain 846b and the second gate 842b is enlarged to increase the second gate-drain parasitic capacitance $C_{gd2}$.

To overcome the above-mentioned problem, the present embodiment adopts the foregoing concept of compensating the variation of the capacitance and configures a compensation capacitance in each one of the adjacent pixel structures to compensate the variation of the gate-drain parasitic capacitance $C_{gd}$ through the compensation capacitance. In particular, the gate-drain parasitic capacitance $C_{gd}$ and the compensation capacitance $C_{compensation}$ must comply the following relationship that when the gate-drain parasitic capacitance $C_{gd}$ is decreased, the compensation capacitance $C_{compensation}$ must be increased correspondingly, and when the gate-drain parasitic capacitance $C_{gd}$ is increased, the compensation capacitance $C_{compensation}$ must be decreased correspondingly. Accordingly, the variation amount of the total parasitic capacitance in a single pixel structure is decreased and the variation between the total parasitic capacitance of the adjacent pixel structures is also decreased to improve the display quality.

As shown in FIG. 8, the first pixel structure 800a further includes a first capacitance compensation portion 860a electrically connected to the first pixel electrode 850a, and the first capacitance compensation portion 860a and the first scan line 810a keep in a first gap S1 in the in-plane direction parallel to the figure sheet to induce a transverse first compensation capacitance $C_{compensation1}$. More particularly, the first capacitance compensation portion 860a and the first pixel electrode 850a are respectively located at two opposite sides of the first scan line 810a and the first capacitance compensation portion 860a is connected to the first drain 846a through a first connection potion 870a traversing the first scan line 810a. The first capacitance compensation portion 860a is, for example, a bar-shaped structure extending along the first scan line 810a. Similarly, the second pixel structure 800b further includes a second capacitance compensation portion 860b electrically connected to the second pixel electrode 850b, and the second capacitance compensation portion 860b keeps a second gap S from the second scan line 810b in the in-plane direction parallel to the figure sheet to induce a transverse second compensation capacitance $C_{compensation2}$. More particularly, the second capacitance compensation portion 860b and the second pixel electrode 850b are located at two opposite sides of the second scan line 810b and the second capacitance compensation portion 860b is connected to the second drain 846b through a second connection portion 870b traversing the second scan line 810b.

The second capacitance compensation portion 860b is, for example, a bar-shaped structure extending along the second scan line 810b.

Specifically, the first gate-drain parasitic capacitance $C_{gd1}$ is relatively decreased when the overlapping region between the first drain 846a and the first gate 842a is reduced by the misalignment in the manufacturing process. Meanwhile, the overlapping region between the second drain 846b and the second gate 842b is enlarged to increase the second gate-drain parasitic capacitance $C_{gd2}$ relatively. However, owing to the disposition of the first capacitance compensation portion 860a and the second capacitance compensation portion 860b, the first compensation capacitance $C_{compensation1}$ is increased and the second compensation capacitance $C_{compensation2}$ is decreased to compensate the variations of the first gate-drain compensation capacitance $C_{gd1}$ and the second gate-drain compensation capacitance $C_{gd2}$, and minimize the difference between the total parasitic capacitances of the first pixel structure 800a and the second pixel structure 800b. In a preferred condition, the total parasitic capacitances of the first pixel structure 800a and the second pixel structure 800b adjacent thereto are capable of being kept the same to provide an even display quality.

On the contrary, the first gate-drain parasitic capacitance $C_{gd1}$ is relatively increased when the overlapping region between the first drain 846a and the first gate 842a is enlarged by the misalignment in the manufacturing process. Meanwhile, the overlapping region between the second drain 846b and the second gate 842b is reduced to decrease the second gate-drain parasitic capacitance $C_{gd2}$ relatively. However, owing to the disposition of the first capacitance compensation portion 860a and the second capacitance compensation portion 860b, the first compensation capacitance $C_{compensation1}$ is decreased and the second compensation capacitance $C_{compensation2}$ is increased to compensate the variations of the first gate-drain compensation capacitance $C_{gd1}$ and the second gate-drain compensation capacitance $C_{gd2}$ and minimize the difference between the total parasitic capacitances of the first pixel structure 800a and the second pixel structure 800b. In a preferred condition, the total parasitic capacitances of the first pixel structure 800a and the second pixel structure 800b adjacent thereto are capable of being kept the same to provide an even display quality.

Figure 9:
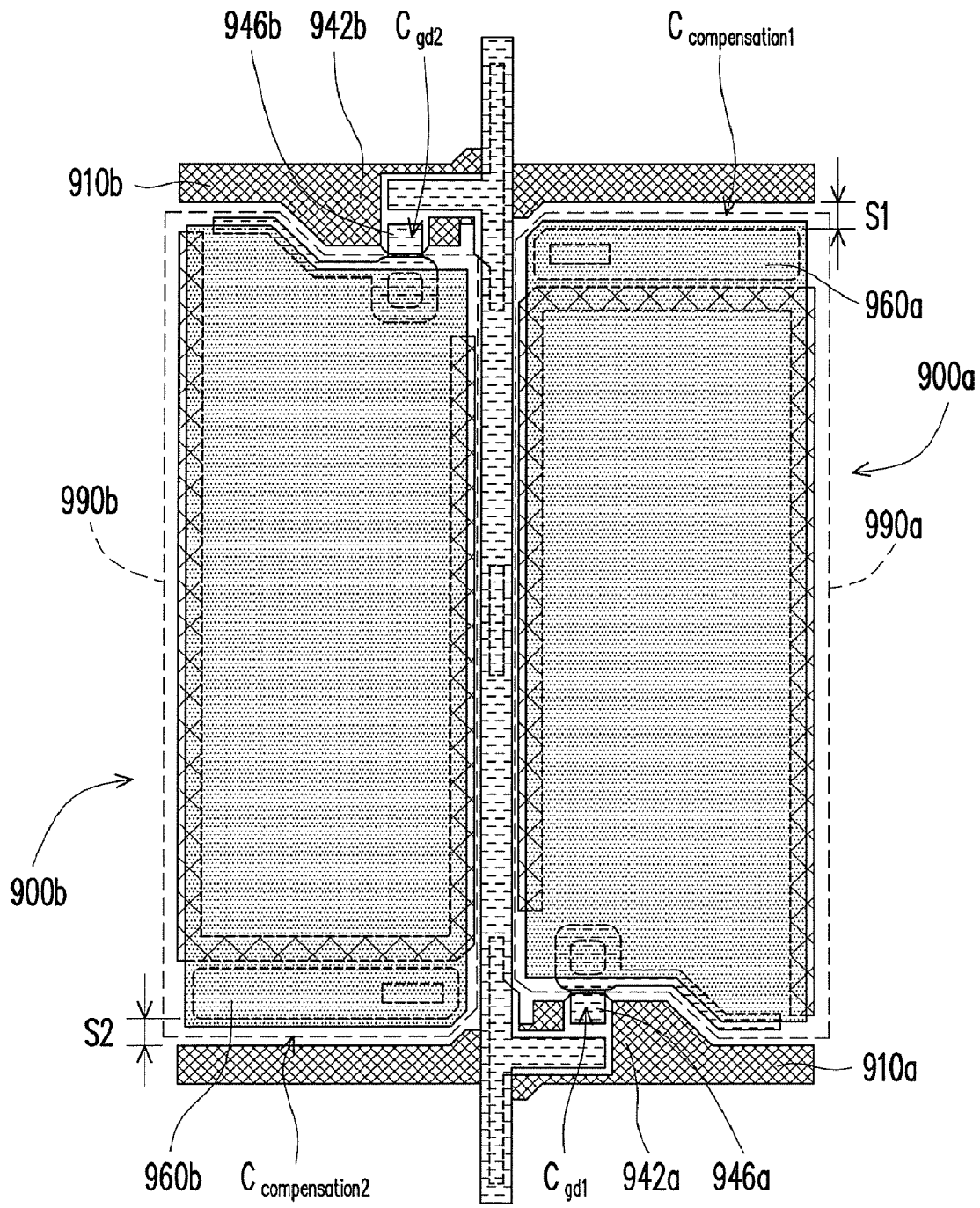
FIG. 9 illustrates a pixel structure according to further another embodiment of the present invention.

In addition to the above pixel structure, FIG. 9 further illustrates a pixel structure according to another embodiment of the present invention to depict another implement type of the above-mentioned design concept. The pixel structure shown in FIG. 6 is applied to the TFT array substrate shown in FIG. 7 in the present embodiment, wherein the two adjacent pixel structures share one data line and thus the elements in each of the pixel structures such as a TFT, a pixel electrode and a common line are configured symmetrically.

The elements shown in the foregoing embodiments are not repeated here and the related description is omitted. As shown in FIG. 9, the first capacitance compensation portion 960a of the first pixel structure 900a in the present embodiment is a block structure extending along the second scan line 910b and is located at the same first pixel region 990a where the first pixel electrode 950a is located at. The first drain 946a is adjacent to the first scan line 910a. The first capacitance compensation portion 960a is adjacent to the second scan line 910b and keeps a first gap S from the second scan line 910b in the in-plane direction. In another word, the first capacitance compensation portion 960a is modified to be configured beside the second scan line 910b in the present embodiment such that the first capacitance compensation portion 960a keeps the first gap S1 from the second scan line 910b to induce the first compensation capacitance $C_{compensation1}$.

Similarly, the second capacitance compensation portion 960b of the second pixel structure 900b is, for example, a block structure extending along the first scan line 910a and located at the same second pixel region 990b where the second pixel electrode 950b is located at. The second drain 946b is adjacent to the second scan line 910b. The second capacitance compensation portion 960b is adjacent to the first scan line 910a and keeps a second gap S2 from the first scan line 910a in the in-plane direction. In another word, the second capacitance compensation portion 960b is modified to be configured beside the first scan line 910a in the present embodiment such that the second capacitance compensation portion 960b keeps the second gap S2 from the first scan line 910a to induce the second compensation capacitance $C_{compensation2}$.

Specifically, the first gate-drain parasitic capacitance $C_{gd1}$ is relatively decreased when the overlapping region between the first drain 946a and the first gate 942a is reduced by the misalignment in the manufacturing process. Meanwhile, the overlapping region between the second drain 946b and the second gate 942b is enlarged to increase the second gate-drain parasitic capacitance $C_{gd2}$ relatively. However, owing to the disposition of the first capacitance compensation portion 960a and the second capacitance compensation portion 960b, the first compensation capacitance $C_{compensation1}$ is increased and the second compensation capacitance $C_{compensation2}$ is decreased to compensate the variations of the first gate-drain compensation capacitance $C_{gd1}$ and the second gate-drain compensation capacitance $C_{gd2}$ and minimize the difference between the total parasitic capacitances of the first pixel structure 900a and the second pixel structure 900b. In a preferred condition, the total parasitic capacitances of the first pixel structure 900a and the second pixel structure 900b adjacent thereto are kept equivalent to one another to provide an even display quality.

On the contrary, the first gate-drain parasitic capacitance $C_{gd1}$ is relatively increased when the overlapping region between the first drain 946a and the first gate 942a is enlarged by the misalignment in the manufacturing process. Meanwhile, the overlapping region between the second drain 946b and the second gate 942b is reduced to decrease the second gate-drain parasitic capacitance $C_{gd2}$ relatively. However, owing to the disposition of the first capacitance compensation portion 960a and the second capacitance compensation portion 960b, the first compensation capacitance $C_{compensation1}$ is decreased and the second compensation capacitance $C_{compensation2}$ is increased to compensate the variations of the first gate-drain compensation capacitance $C_{gd1}$ and the second gate-drain compensation capacitance $C_{gd2}$ and minimize the difference between the total parasitic capacitances of the first pixel structure 900a and the second pixel structure 900b. In a preferred condition, the total parasitic capacitances of the first pixel structure 900a and the second pixel structure 900b adjacent thereto are kept equivalent to one another to provide an even display quality.

Figure 10:
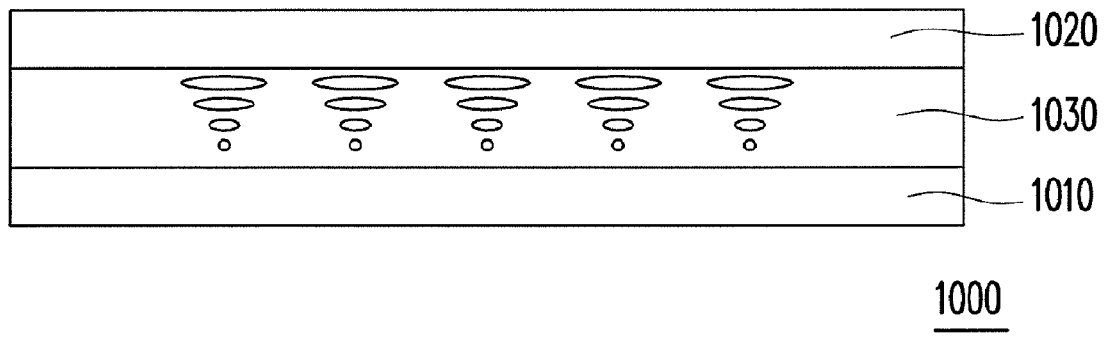
FIG. 10 illustrates a schematic diagram of a display panel according to an embodiment of the present invention.
Figure 11:
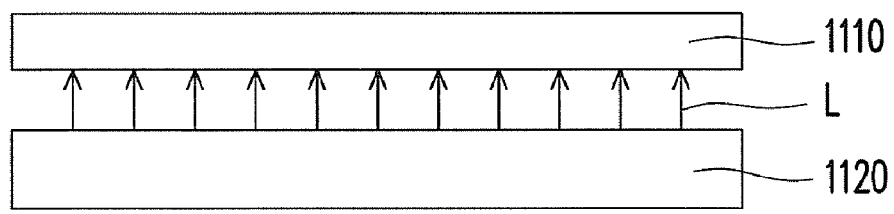
FIG. 11 illustrates a display apparatus according to an embodiment of the present invention

FIG. 10 illustrates a schematic diagram of a display panel according to an embodiment of the present invention. Referring to FIG. 10, the display panel 1000 of the present embodiment includes a TFT array substrate 1010, an opposite substrate 1020 and a display medium layer 1030 disposed between the TFT array substrate 1010 and the opposite substrate 1020. The TFT array substrate 1010 can be the TFT array substrates illustrated in the above-mentioned embodiments or other TFT array substrates not illustrated. The opposite substrate 1020 is a color filter substrate. Certainly, under certain circumstances, the opposite substrate 1020 can also be a glass substrate or a quartz substrate having only a common electrode thereon while the corresponding TFT array substrate 1010 has the color filter layer thereon. In the present embodiment, the display medium layer 1030 is, for example, a liquid crystal layer and the display panel 1000 is a liquid crystal display panel. Alternatively, the display medium layer 1030 may be an electroluminescent material layer in other embodiments and thus the display panel 1000 is an electroluminescent display panel, wherein the electroluminescent material can be an organic material, an inorganic material or a combination thereof FIG. 11 further illustrates a display apparatus applying the above-mentioned display panel according to an embodiment of the present invention. A liquid crystal display apparatus is taken as an example. The liquid crystals are non-luminance and therefore a backlight module 1120 is disposed beside the liquid crystal display panel 1110. The backlight module 1120 provides the light L to the liquid crystal display panel 1110 to render the liquid crystal display panel 1110 display an image.

In brief, the pixel structure provided in the above embodiments adapt for compensating variation of gate-drain parasitic capacitance caused by misalignment in the manufacturing process through forming a transverse compensation capacitance between a capacitance compensation portion and a scan line in an in-plane direction, and therefore the flicker in displaying of a display panel can be alleviated. In addition, being applied into the concept of "data lines reducing", the pixel structures are capable of reducing the difference of capacitances between two adjacent pixel structures due to the misalignment in the manufacturing process and are apt to improve the display uniformity.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A pixel structure, comprising:
a first scan line;
a second scan line, an extending direction of the first scan line being parallel to an extending direction of the second scan line;
a data line intersected with the first scan line and the second scan line to define a pixel region;
a thin film transistor located inside the pixel region, and the thin film transistor having a gate, a source and a drain, wherein the gate is connected to the first scan line, the source is connected to the data line, and the drain overlaps the gate in an overlapping region in an out-plane direction to form a gate-drain parasitic capacitance;
a pixel electrode located in the pixel region and the pixel electrode electrically connected to the drain; and
a capacitance compensation portion electrically connected to the pixel electrode and the capacitance compensation portion keeping a gap from the first scan line or the second scan line in an in-plane direction to induce a compensation capacitance, wherein the drain and the capacitance compensation portion are configured that:
when the overlapping region is reduced to decrease the gate-drain parasitic capacitance, the gap is reduced correspondingly to increase the compensation capacitance, and when the overlapping region is enlarged to increase the gate-drain parasitic capacitance, the gap is enlarged correspondingly to decrease the compensation capacitance.

2. The pixel structure according to claim 1, wherein the capacitance compensation portion is a bar-shaped structure or a block structure extending along the first scan line or the second scan line.

3. The pixel structure according to claim 1, wherein the capacitance compensation portion and the pixel electrode are respectively located at two opposite sides of the first scan line.

4. The pixel structure according to claim 3, further comprising a connection portion traversing the first scan line and connected between the capacitance compensation portion and the drain.

5. The pixel structure according to claim 1, wherein the capacitance compensation portion is located inside the pixel region, the drain is adjacent to the first scan line, and the capacitance compensation portion is adjacent to the second scan line and keeps the gap from the second scan line in the in-plane direction.

6. The pixel structure according to claim 1, further comprising a common line located inside the pixel region and disposed along the periphery of the pixel electrode.

7. A pixel structure, comprising:
a first scan line;
a second scan line, an extending direction of the first scan line being parallel to an extending direction of the second scan line;
a data line intersected with the first scan line and the second scan line to define a first pixel region and a second pixel region adjacent to the first pixel region, and the first pixel region and the second pixel region being respectively located at two opposite sides of the data line;
a first thin film transistor located inside the first pixel region, and the first thin film transistor having a first gate, a first source and a first drain, wherein the first gate is connected to the first scan line, the first source is connected to the data line, and the first drain overlaps the first gate in a first overlapping region in an out-plane direction to form a first gate-drain parasitic capacitance;
a first pixel electrode located inside the first pixel region and the first pixel electrode electrically connected to the first drain;
a first capacitance compensation portion electrically connected to the first pixel electrode and the first capacitance compensation portion keeping a first gap from the first scan line or the second scan line in an in-plane direction to induce a first compensation capacitance, and the first drain and the first capacitance compensation portion being configured that: when the first overlapping region is reduced to decrease the first gate-drain parasitic capacitance, the first gap is reduced correspondingly to increase the first compensation capacitance, and when the first overlapping region is enlarged to increase the first gate-drain parasitic capacitance, the first gap is enlarged correspondingly to decrease the first compensation capacitance;
a second thin film transistor located inside the second pixel region, and the second thin film transistor having a second gate, a second source and a second drain, wherein the second gate is connected to the second scan line, the second source is connected to the data line, and the second drain overlaps the second gate in a second overlapping region in the out-plane direction to form a second gate-drain parasitic capacitance;

a second pixel electrode located inside the second pixel region and the second pixel electrode electrically connected to the second drain; and a second capacitance compensation portion electrically connected to the second pixel electrode and the second capacitance compensation portion keeping a second gap from the first scan line or the second scan line in the in-plane direction to induce a second compensation capacitance, and the second drain and the second capacitance compensation portion being configured that: when the second overlapping region is reduced to decrease the second gate-drain parasitic capacitance, the second gap is reduced correspondingly to increase the second compensation capacitance, and when the second overlapping region is enlarged to increase the second gate-drain parasitic capacitance, the second gap is enlarged correspondingly to decrease the second compensation capacitance.

8. The pixel structure according to claim 7, wherein the first capacitance compensation portion is a bar-shaped structure or a block structure extending along the first scan line or the second scan line.

9. The pixel structure according to claim 8, wherein the second capacitance compensation portion is a bar-shaped structure or a block structure extending along the first scan line or the second scan line.

10. The pixel structure according to claim 7, wherein the first capacitance compensation portion and the first pixel electrode are respectively located at two opposite sides of the first scan line.

11. The pixel structure according to claim 10, further comprising a first connection portion traversing the first scan line and connected between the first capacitance compensation portion and the first drain.

12. The pixel structure according to claim 10, wherein the second capacitance compensation portion and the second pixel electrode are respectively located at two opposite sides of the second scan line.

13. The pixel structure according to claim 12, further comprising a second connection portion traversing the second scan line and connected between the second capacitance compensation portion and the second drain.

14. The pixel structure according to claim 7, wherein the first capacitance compensation portion is located inside the first pixel region, the first drain is adjacent to the first scan line, and the first capacitance compensation portion is adjacent to the second scan line and keeps the first gap from the second scan line in the in-plane direction.

15. The pixel structure according to claim 14, wherein the second capacitance compensation portion is located inside the second pixel region, the second drain is adjacent to the second scan line, and the second capacitance compensation portion is adjacent to the first scan line and keeps the second gap from the first scan line in the in-plane direction.

16. The pixel structure according to claim 7, further comprising two common lines respectively located inside the first pixel region and the second pixel region and respectively disposed along the peripheries of the first pixel electrode and the second pixel electrode.

17. A thin film transistor array substrate, comprising:
a substrate having a plurality of pixel regions;
a plurality of scan lines disposed on the substrate;
a plurality of data lines disposed on the substrate and the data lines being intersected with the scan lines;
a plurality of thin film transistors located in the pixel regions respectively, and each of the thin film transistors having a gate, a source and a drain, wherein the gate is connected to the corresponding scan line, the source is connected to the corresponding data line, and the drain overlaps the gate in an overlapping region in an out-plane direction to form a gate-drain parasitic capacitance;

a plurality of pixel electrodes respectively disposed inside the pixel regions and electrically connected to the corresponding drains; and a plurality of capacitance compensation portion disposed corresponding to the pixel regions, wherein each of the capacitance compensation portions keeps a gap from one of the two scan lines at two opposite sides of the corresponding pixel region in an in-plane direction to induce a compensation capacitance, and each of the drains and the corresponding capacitance compensation portion are configured that:

when the overlapping region is reduced to decrease the gate-drain parasitic capacitance, the gap is reduced correspondingly to increase the compensation capacitance, and when the overlapping region is enlarged to increase the gate-drain parasitic capacitance, the gap is enlarged correspondingly to decrease the compensation capacitance.

18. The thin film transistor array substrate according to claim 17, wherein each of the capacitance compensation portions is a bar-shaped structure or a block structure extending along the corresponding scan line.

19. The thin film transistor array substrate according to claim 17, wherein each of the capacitance compensation portions and the corresponding pixel electrode are respectively located at two opposite sides of a scan line.

20. The thin film transistor array substrate according to claim 19, further comprising a plurality of connection portions disposed corresponding to the pixel regions, wherein each of the connection portions traverses the corresponding scan line and is connected between the corresponding capacitance compensation portion and the corresponding drain.

21. The thin film transistor array substrate according to claim 17, wherein each of the capacitance compensation portions and the corresponding pixel electrode are located inside one of the pixel regions and are respectively adjacent to the two scan lines at two opposite sides of the one of the pixel regions, and the capacitance compensation portion keeps the gap from the close scan line in the in-plane direction.

22. The thin film transistor array substrate according to claim 17, wherein the pixel regions are arranged in columns and rows, the scan lines extend along the direction of the rows, the data lines extend along the direction of the columns, wherein each two adjacent pixel regions in the same row are delimited a group, the two thin film transistors inside the two pixel regions of the same group are simultaneously connected to the same data line which is located between the two pixel regions.

23. The thin film transistor array substrate according to claim 22, wherein the two thin film transistors inside the two pixel regions of the same group are respectively adjacent to two different scan lines and are respectively connected to the two different scan lines.

24. The thin film transistor array substrate according to claim 17, further comprising a plurality of common lines respectively disposed inside the pixel regions and each of the common lines being disposed along the periphery of the corresponding pixel electrode.

25. A display panel, comprising:
a thin film transistor array substrate, comprising:
a substrate having a plurality of pixel regions;
a plurality of scan lines disposed on the substrate;

a plurality of data lines disposed on the substrate and the data lines being intersected with the scan lines;

a plurality of thin film transistors located inside the pixel regions respectively and each of the thin film transistors having a gate, a source and a drain, wherein the gate is connected to the corresponding scan line, the source is connected to the corresponding data line, and the drain overlaps the gate in an overlapping region in an out-plane direction to form a gate-drain parasitic capacitance;

a plurality of pixel electrodes respectively disposed inside the pixel regions and electrically connected to the corresponding drains;

a plurality of capacitance compensation portion disposed corresponding to the pixel regions, wherein each of the capacitance compensation portion keeps a gap from one of the two scan lines at two opposite sides of the corresponding pixel region in an in-plane direction, and each of the drain and the corresponding capacitance compensation portion are configures that: when the overlapping region is reduced to decrease the compensation capacitance, the gap is reduced correspondingly to increase the compensation capacitance, and when the overlapping region is enlarged to increase the gate-drain parasitic capacitance, the gap is enlarged correspondingly to decrease the compensation capacitance;

an opposite substrate; and a display medium layer disposed between the thin film transistor array substrate and the opposite substrate.

26. The display panel according to claim 25, wherein each of the capacitance compensation portions is a bar-shaped structure or a block structure extending along the corresponding scan line.

27. The display panel according to claim 25, wherein each of the capacitance compensation portions and the corresponding pixel electrode are respectively located at two opposite sides of the same scan line.

28. The display panel according to claim 27, wherein the thin film transistor array substrate further comprises a plurality of connection portions disposed corresponding to the pixel regions, wherein each of the connection portions traverses the corresponding scan line and is connected between the corresponding capacitance compensation portion and the corresponding drain.

29. The display panel according to claim 25, wherein each of the capacitance compensation portions and the corresponding pixel electrode are located inside one of the pixel regions and are respectively adjacent to the two scan lines at two opposite sides of the one of the pixel regions, and the capacitance compensation portion keeps the gap from the close scan line in the in-plane direction.

30. The display panel according to claim 25, wherein the pixel regions are arranged in columns and rows, the scan lines extend along the direction of the rows, the data lines extend along the direction of the columns, wherein each two adjacent pixel regions in the same row are delimited a group, the two thin film transistors inside the two pixel regions of the same group are simultaneously connected to the same data line which is located between the two pixel regions.

31. The display panel according to claim 30, wherein the two thin film transistors inside the two pixel regions of the same group are respectively adjacent to two different scan lines and are respectively connected to the two different scan lines.

32. The display panel according to claim 25, wherein the thin film transistor array substrate further comprises a plurality of common lines respectively disposed inside the pixel regions and each of the common lines is disposed along the periphery of the corresponding pixel electrode.

33. The display panel according to claim 25, wherein the opposite substrate is a color filter substrate.

34. The display panel according to claim 25, wherein the display medium layer is a liquid crystal layer.

35. A display apparatus, comprising:

a display panel according to claim 25; and a backlight module disposed beside the display panel to provide a back light to the display panel.

* * * * *